(12) United States Patent
Kannan et al.

(10) Patent No.: US 9,438,217 B2
(45) Date of Patent: Sep. 6, 2016

(54) SYSTEM AND METHOD FOR CLOCKING INTEGRATED CIRCUIT

(71) Applicants: Narayanan Kannan, Delhi (IN); Rohit Srivastava, Noida (IN)

(72) Inventors: Narayanan Kannan, Delhi (IN); Rohit Srivastava, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 46 days.

(21) Appl. No.: 14/337,244

(22) Filed: Jul. 22, 2014

(65) Prior Publication Data

US 2016/0028385 A1 Jan. 28, 2016

(51) Int. Cl.
*H03K 3/00* (2006.01)
*H03K 5/13* (2014.01)
*H03K 5/135* (2006.01)

(52) U.S. Cl.
CPC .............. *H03K 5/131* (2013.01); *H03K 5/133* (2013.01); *H03K 5/135* (2013.01)

(58) Field of Classification Search
CPC ....................................................... H03K 5/131
See application file for complete search history.

(56) References Cited

U.S. PATENT DOCUMENTS

| | | | |
|---|---|---|---|
| 6,977,539 B1 | 12/2005 | McDonagh | |
| 7,284,143 B2 | 10/2007 | Song | |
| 7,868,679 B2 | 1/2011 | Riedel | |
| 7,895,488 B1 | 2/2011 | Bertanzetti | |
| 7,944,241 B1 | 5/2011 | Sharma | |
| 7,954,000 B2* | 5/2011 | Allen | G06F 1/10 327/295 |
| 8,368,428 B2 | 2/2013 | Vo | |
| 8,614,571 B2 | 12/2013 | Tseng | |
| 2003/0154455 A1 | 8/2003 | Yoshida | |
| 2005/0055614 A1 | 3/2005 | Yeh | |
| 2009/0119552 A1 | 5/2009 | Chelstrom | |

OTHER PUBLICATIONS

Ransford Hyman, Jr., Nagarajan Ranganathan, Thomas Bingel, and Deanne Tran Vo, "A Clock Control Strategy for Peak Power and RMS Current Reduction Using Path Clustering", IEEE Transactions on Very Large Scale Integration (VLSI) Systems, Vol. 21, No. 2, Feb. 2013.
P. Vuillod, L. Benini, A. Bogliolo, G. De Micheli; "Clock-skew optimization for peak current reduction", Proceedings of the 1996 International Symposium on Low Power Electronics and Design (ISLPED), pp. 265-270, IEEE Press Piscataway, NJ, USA © 1996.
D. González, A. García, G. A. Jullien, E. Castillo, L. Parrilla and A. LLoris , "Improved Clock Distribution Strategy for RNS-based DSP VLSI Systems," ISSP VLSI Systems, DCIS 2003.
Yakov Kaplan and Shmuel Wimer, "Post Optimization of a Clock Tree for Power Supply Noise Reduction", IEEE 27th Convention of Electrical and Electronics Engineers in Israel, 2012.

* cited by examiner

*Primary Examiner* — Daniel Puentes
(74) *Attorney, Agent, or Firm* — Charles E. Bergere

(57) ABSTRACT

A system and method of clocking an integrated circuit (IC) includes determining operating characteristics of the IC. The IC has multiple domains and each domain receives a respective domain clock signal. A skew value is determined for each of the domain clock signals, where each skew value is associated with a respective domain of the IC. The domain clock signals are generated from a reference clock signal and each domain clock signal is skewed from the reference clock according to the respective skew value.

8 Claims, 8 Drawing Sheets

SYSTEM AND METHOD FOR CLOCKING INTEGRATED CIRCUIT

BACKGROUND OF THE INVENTION

The present invention relates generally to integrated circuits and, more particularly, to a method and system for clocking integrated circuits.

Integrated circuits (IC), such as those implemented on a single silicon substrate and often known as a system-on-chip (SoC), have large numbers of digital components, each or which consumes power. So called dynamic IR-drop is a problem for integrated circuits and results from high peak power consumption by the IC. Dynamic IR-drop may also be known as peak-power IR drop. The dynamic IR-drop can impact the IC's functionality and reliability. Furthermore, high peak current or power can create electromagnetic interference (EMI) issues.

In an IC, each digital component or module is operated in response to a clock signal. FIG. 1A illustrates power consumption for a digital buffer responsive to a clock signal transitioning between a low logic value (0) and a high logic value (1). FIG. 1B illustrates power consumption for a digital system comprising a plurality of digital components in which power consumption is approximately nine times that for the single digital component shown in FIG. 1A. The increase in power consumption is caused by a plurality of the digital components being simultaneously clocked (barring small clock signals delays within the system), which leads to a general overlap of peak power consumption associated with each digital component.

Given that peak power consumption is an issue for ICs, it would be advantageous to be able to reduce peak power consumption in ICs.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
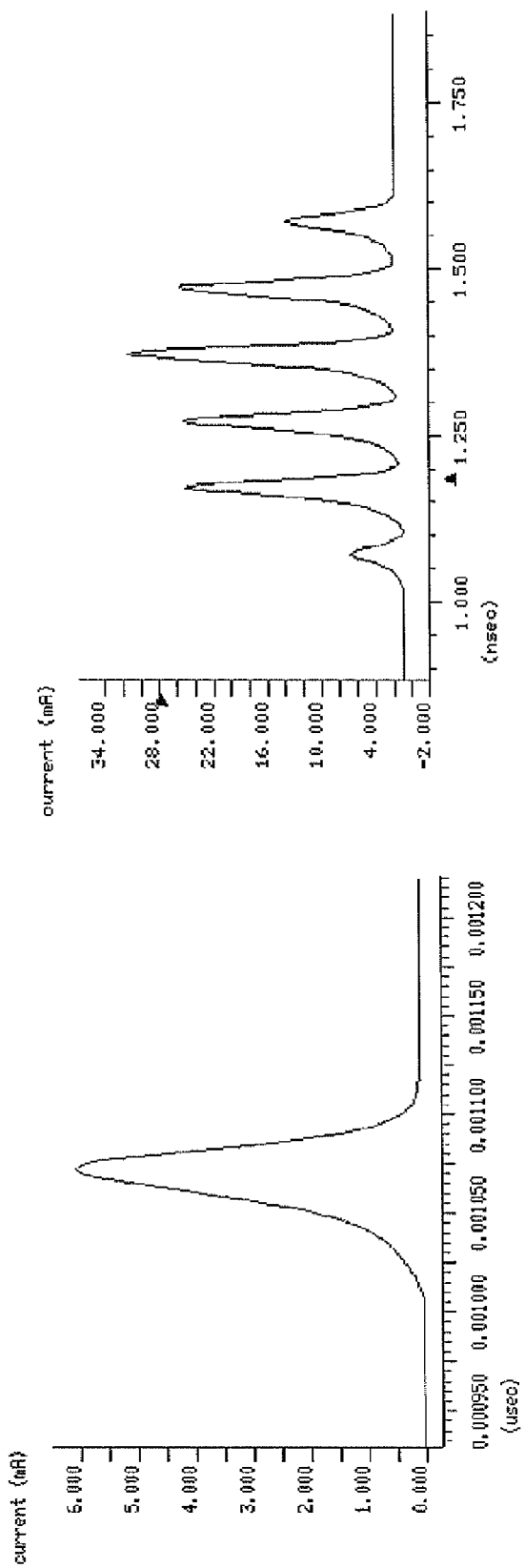
FIGS. 1A and 1B are graphs illustrating current flow in conventional ICs.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a method of clocking an integrated circuit in which a skew value is determined for each of a plurality of domain clock signals each associated with a respective domain of the integrated circuit. The skew values for the plurality of domain clock signals may be dynamically changed during use of the integrated circuit.

In another embodiment, the present invention provides a method of generating a clock skew value for a domain of an integrated circuit based on received IR-drop data. The method includes adjusting one or both of a skew value associated with one or more domains of the integrated circuit, wherein a domain clock signal provided to each domain is skewed from a reference clock according to the respective skew value, and an operating frequency of the integrated circuit according to the IR-drop data.

Figure 2:
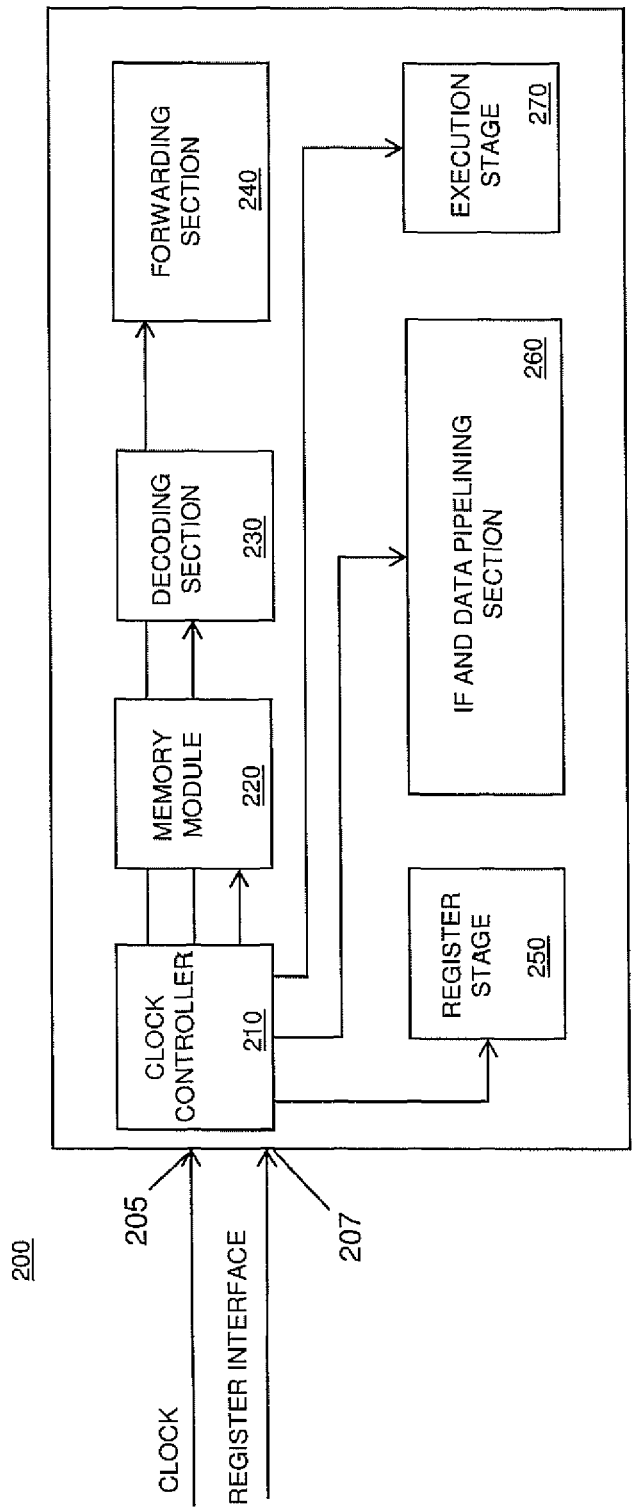
FIG. 2 is a schematic block diagram of an integrated circuit according to an embodiment of the present invention.

Referring now to FIG. 2, an integrated circuit (IC) 200 according to an embodiment of the invention is shown. The IC 200 comprises a clock control module 210 and a plurality of further modules 220, 230, 240, 250, 260, 270 each arranged to receive one of a plurality of domain clock signals that are each skewed or phase-shifted from a reference clock signal, as will be explained. Each of the plurality of modules 220, 230, 240, 250, 260, 270 is arranged within a respective domain of the IC 200. It should be understood, however, that each domain may comprise more than one module where all the modules within the domain receive the same domain clock signal having a respective skew or phase shift from the reference clock signal.

The further modules 220, 230, 240, 250, 260, 270 comprise a memory module 220, a decoding module 230, a forwarding module 240, a register module 250, a pipelining module 260 and an execution module 270. It should be understood that systems according to embodiments of the invention may comprise other modules than those shown in FIG. 2 and that the IC 200 may comprise more or fewer modules than shown. The purpose of the modules shown in FIG. 2 is merely illustrative and the IC 200 may comprise other modules than those described.

The IC 200 comprises a clock input 205 for receiving a reference clock signal. The reference clock signal is a digital clock signal comprising periodically spaced logic low values and logic high values. The logic low value may be a logic level 0 and the logic high value may be a logic level 1. The reference clock may be generated by a reference clock module (not shown) and may have a controllable frequency, as will be explained.

The IC 200 further comprises an input 207 for receiving skew data indicative of a skew value of one or more of the domain clock signals from the reference clock signal. It should be understood that the skew data may be understood to define a phase shift of the domain clock signal from the reference clock signal. The skew data is received by the clock control module 210 for programming the clock control module 210 to generate the domain clocks signals from the reference clock signal according to the received skew value. The skew data may be received prior to use of the IC 200 or may be received while the IC 200 is in use to reconfigure the skew value associated with at least one domain clock signal. The clock control module 210 is arranged to generate the plurality of domain clock signals skewed in time from the reference clock according to the skew data in order to reduce peak power in the IC 200. The skew data may be provided to the clock control module 210 by a control unit (not shown in FIG. 2), such as a processor, of a circuit comprising the IC 200 or of another apparatus communicably coupled with the IC 200. The skew data may be provided by an apparatus to be described with reference to FIG. 7, although it should be appreciated that the skew data may be provided from other sources. The control unit may determine the skew data from, or based on, data in a data store, such as a memory, associated with the control unit as will be explained. The clock control module 210 may comprise a plurality of clock generators each for generating a respective domain clock signal. A clock generator according to an embodiment of the invention will be explained with reference to FIG. 5.

Figure 3:
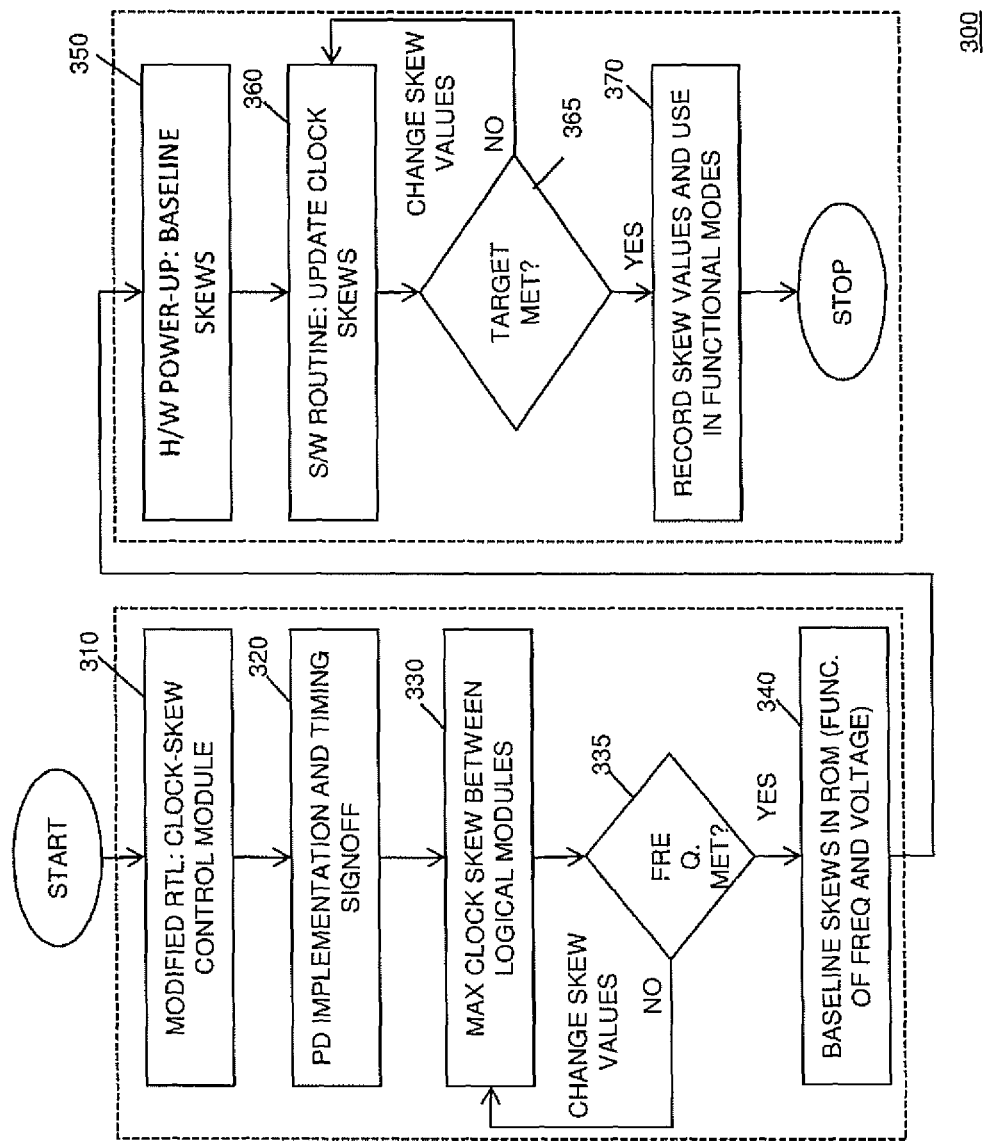
FIG. 3 is a flow chart of a method according to an embodiment of the present invention.

FIG. 3 illustrates a method 300 according to an embodiment of the invention. The method 300 comprises first 301 and second phases 302 that may each be performed at different times. The first phase 301 may be performed, at least partly, during a design process of an integrated circuit, such as of the IC 200. The second phase 302 may be performed when using the IC, such as during use of the IC 200. Therefore a period of time may exist between the first and second phases 301, 302 being performed. Thus the first and second phases 301, 302 may each be considered as separate methods according to embodiments of the invention.

The first phase 301 comprises a step of designing a digital system. The digital system comprises a clock control module 210 and a plurality of further modules each arranged to receive one of a plurality of domain clock signals. The digital system may be as illustrated in FIG. 2. Designing the digital system may comprise selecting a plurality of functional circuit blocks. During the design process a physical layout of the modules is determined. The layout may be determined manually, by appropriate design software generating the layout or a combination thereof. The plurality of domain clock signals may be arranged to be provided to respective domains of the digital system based on a timing delay to regions of the digital system. Regions of the system having similar timing delays may be grouped together to form a domain based on the timing delay. In this way each domain clock signal is provided to a region of the digital system having similar timing delays. The timing delays may be determined by simulation of the digital system.

The method 300 comprises a step 320 in which an initial clock skew value is determined for each of the plurality of domain clock signals. The initial clock skew value may be selected by a user, may be randomly selected, or may be determined based on the timing delay to the domain of the digital system determined in step 310.

In step 330 it is determined whether one or more operational constraints of the digital system are met based on the clock skew values. Step 330 may comprise simulating the digital system or may comprise analyzing a performance of a physical implementation of the digital system. The operational constraints may comprise an operating frequency of the digital system i.e. whether the digital system is able to operate at a desired frequency given the clock skew values. The operational constraints may comprise other timing constraints of the digital system. The operational constraints may comprise a maximum peak current of the digital system i.e., whether the digital system draws less than a maximum peak current in operation.

In step 330, if it is determined that the one or more operational constraints are not met, then the method returns to step 320. In returning to step 320 the clock skew values for at least some of the domains of the digital system are changed. In some embodiments, if one or more of the frequency or timing constraints are not met, then the clock skew values for at least some of the domains may be reduced. That is a phase shift between the clock signals for the domains and the reference clock may be reduced. However if the maximum peak current constraint is not met, then in some embodiments the clock skew values for at least some of the domains may be increased i.e. the phase shift may be increased. Following a reiteration of step 320, the method returns to step 330 where it is determined whether the one or more operational constraints of the digital system are met based on the changed clock skew values.

If, in step 340, it is determined that one or more operational constraints of the digital system are met, then the method moves to step 340 where the clock skew values are stored. The clock skew values may be stored in a data storage device or medium, such as a Read-Only Memory (ROM). The clock skew values may be referred to as baseline clock skew values which will be used by the digital system following start-up or re-initialization.

In some embodiments, steps 320 to 340 may be repeated for each of a plurality of operating conditions of the digital system. The operating conditions may comprise an operating voltage and/or an operating frequency of the digital system. For example, in one embodiment, steps 320 to 340 may be performed for a plurality of operating voltages and/or a plurality of operating frequencies of the digital system. Thus, in step 340, one or more clock skew values are stored for each operating condition of the digital system. In one embodiment a look-up table is stored where the one or more clock skew values are indexed according to the operating conditions such that the clock skew values may be retrieved according to the operating conditions. For example the clock skew values for a particular operating frequency and voltage may be obtained from the look-up table. It will be realized that other data storage structures may be used. Advantageously this allows clock skew values to be stored for use in a system having dynamic voltage control and/or frequency scaling, for example a digital system for use in a mobile device.

The second phase 302 of the method 300 may be performed during operation of the digital system i.e., in use. The method comprises a step 350 of loading clock skew values. The clock skew values may be loaded from the data storage device or medium in which they were stored in step 340. The clock skew values may be baselines clock skew values. In some embodiments, step 350 may comprise determining one or more operating characteristics of the digital system, such as the operating voltage and/or frequency of the digital system. The clock skew values may be selected according to the one or more operating characteristics. The clock skew values for the operating characteristics are selectively retrieved from the data storage device. In particular, step 350 may be performed following power-on or a reset of the digital system. Step 350 may be performed by hardware of the digital system following the power-on or the reset.

Step 350 may be performed by the control unit described with reference to FIG. 2. The skew values may be communicated to the clock control module 210 of the system shown in FIG. 2 via the skew data input 207 by the control unit. The clock control module 210 is arranged to generate the domain clock signals according to the received skew values.

In step 360 at least some of the clock skew values are updated or changed. The clock skew values may be changed by a software routine such as executed by the control unit. The clock skew values may be changed in order to reduce, or to obtain an optimum (which may be lowest), peak current consumption of the digital system or to obtain a peak current consumption which is below a predetermined threshold, as will be explained. The clock skew value of only some or all of the domains of the digital system may be changed in step 360. The changed clock skew values may be communicated from the control unit to the clock control module 210.

In step 370 it is determined whether one or more operational constraints of the digital system are met based on the clock skew values. The operational constraints may comprise an operating frequency of the digital system i.e. whether the digital system is able to operate at a desired frequency given the clock skew values. The operational constraints may comprise other timing constraints of the digital system. The operational constraints may comprise a maximum peak current of the digital system i.e., whether the digital system draws less than a maximum peak current in operation. The one or more operational constraints of the digital system may be those considered in step 330. In some embodiments, step 370 may comprise storing the maximum peak current consumption associated with the clock skew values to enable a comparison of a plurality of clock skew values, for example to determine a lowest peak current consumption of the digital system for the plurality of clock skew values.

In step 370, if it is determined that the one or more operational constraints are not met, then the method returns to step 360. In returning to step 360 the clock skew values for at least some of the domains of the digital system are changed. In some embodiments, if one or more of the frequency or timing constraints are not met, then the clock skew values for at least some of the domains may be reduced. However if the maximum peak current constraint is not met, then in some embodiments the clock skew values for at least some of the domains may be increased. Following a reiteration of step 360 the method returns to step 370 where it is determined whether the one or more operational constraints of the digital system are met based on the changed clock skew values. In some embodiments steps 360 and 370 may be repeated for a plurality of clock skew values in order to determine optimum clock skew values, such as those resulting in a lowest peak current consumption.

If, in step 370, it is determined that the one or more operational constraints of the digital system are met, then the method moves to step 380 where the clock skew values are utilized. That is, in step 380 the digital system is operated according to the clock skew values. The determined clock skew values may be provided to the control module 210 via input 207, as previously described.

Figure 4:
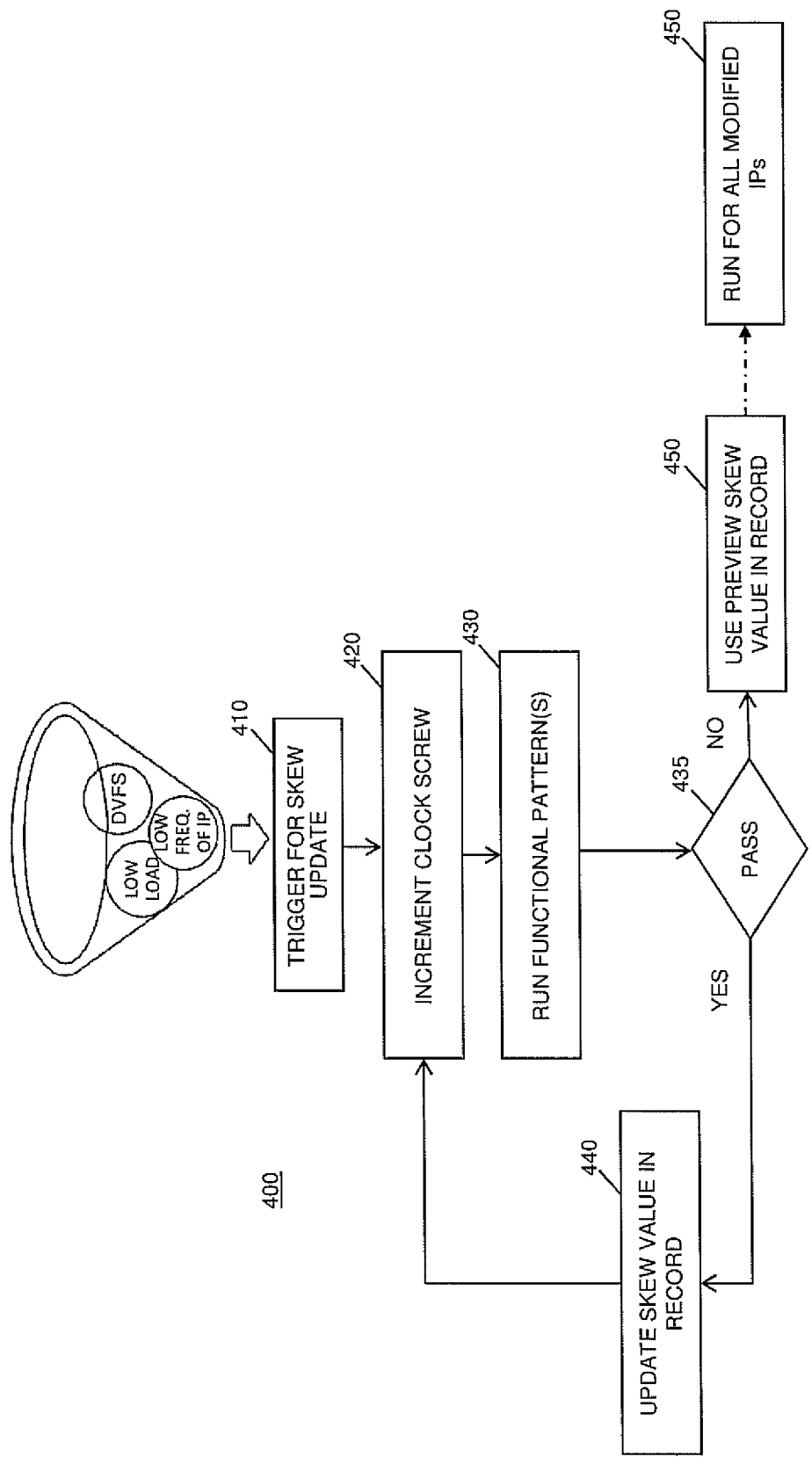
FIG. 4 is a flow chart of a method according to a further embodiment of the present invention.

FIG. 4 illustrates a method 400 according to an embodiment of the invention. The method 400 is a method of determining clock skew values for use in a digital system. The method 400 may be performed during use of the digital system, such as in steps 360 and 370 of the method 300 previously described with reference to FIG. 3. The method 400 is performed with respect to one or more operating characteristics 405 of the digital system. The operating characteristics 405 may comprise one or more of a frequency of operation of the digital system, a load placed upon the digital system, such as a processing workload, an operating voltage of the digital system, and dynamic voltage and frequency scaling (DVFS) of the digital system.

The method comprises a step 410 of receiving a trigger to update the clock skew values. The trigger may be an expiration of a timer, in embodiments where the clock skew values are periodically updated, or may be another event such as a change in one or more operating characteristics of the digital system. In one embodiment the trigger may be an interrupt caused by a determination of an IR-drop in the digital system.

In step 420 at least some of the clock skew values are changed. The change may comprise incrementing the at least some clock skew values i.e., increasing a phase difference between the domain clock signals and the reference clock signal.

In step 430 operation of the digital system is tested based on the clock skew values determined in step 420. The operation of the digital system may be tested by running one or more test routines, such as functional operation patterns, on the digital system.

In step 435 it is determined whether the digital system is operational based on the skew values selected in step 420 with respect to one or more operational constraints, such as previously described with reference to steps 330 or 370 in FIG. 3.

If the digital system is operational with respect to one or more operational constraints then the method moves to step 440 where the current clock skew values are stored. The clock skew values may be stored in a memory device or register of the digital system.

In a further iteration of step 420 the clock skew values are changed. For example the clock skew values may be further incremented from their current values. Step 430 is repeated following step 410 and in step 435 it is again determined whether the digital system is operational with respect to one or more operational constraints.

If, in step 435, it is determined that the digital system is not operational with respect to the changed skew values the method moves to step 450. In step 450 the previously stored clock skew values are utilized for the digital system. That is, those skew values stored in step 440, prior to a last iteration of step 420, are used to operate the digital system. In this way the method 400 determines, via an iterative method, clock skew values which cause the digital system to not operate according to the one or more operational constraints and to then select a previous set of clock skew values which allowed the digital system to operate according to the one or more operational constraints. A peak current consumption is optimized, or reduced, whilst still meeting the one or more operational constraints.

Figure 5:
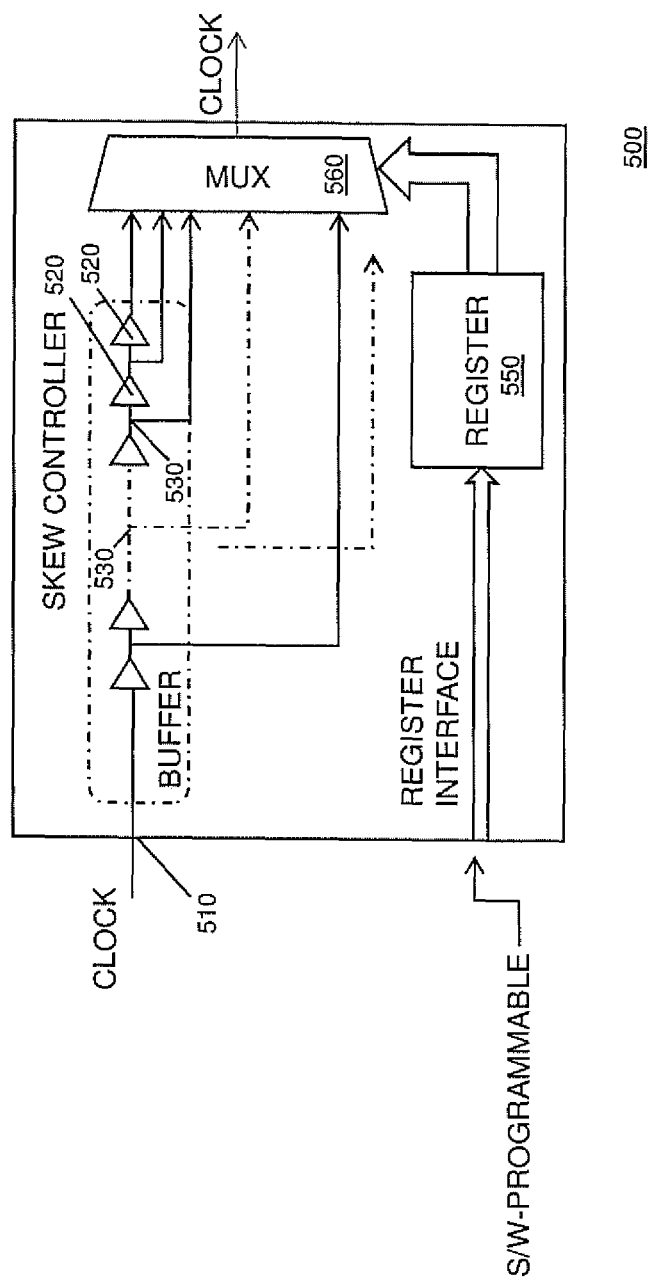
FIG. 5 is a schematic block diagram of a clock generator module according to an embodiment of the present invention.

FIG. 5 illustrates a clock generator module 500 according to an embodiment of the invention. The clock generator module 500 comprises an input 205 for receiving the reference clock signal and an input 207 for receiving skew data indicative of a skew value from the reference clock signal of an output domain clock signal 510. The skew value controls a phase shift of the domain clock signal from the reference clock signal.

The clock generator module 500 comprises a plurality of delay elements or buffers 520 arranged to sequentially receive the reference clock signal. In between at least some of the buffers 520, taps 530 are arranged to each provide a phase shifted version of the reference clock signal to an input of a multiplexer (MUX) 550. The clock generator module 500 further comprises a register 540 arranged to store the received skew data. The clock skew data is used to select an output of the MUX 550 to provide the domain clock signal 510. That is, one of the phase shifted representations provided to the MUX 550 is selected based on the value stored in the register 540 and used as the domain clock signal 510. The clock generator module 500 allows the phase shift or skew of the domain clock signal to be dynamically controlled based on the clock skew data received at input 207. A digital system may comprise a plurality of clock generator modules 500 each associated with a respective domain of the digital system to provide a respective domain clock signal.

Figure 6:
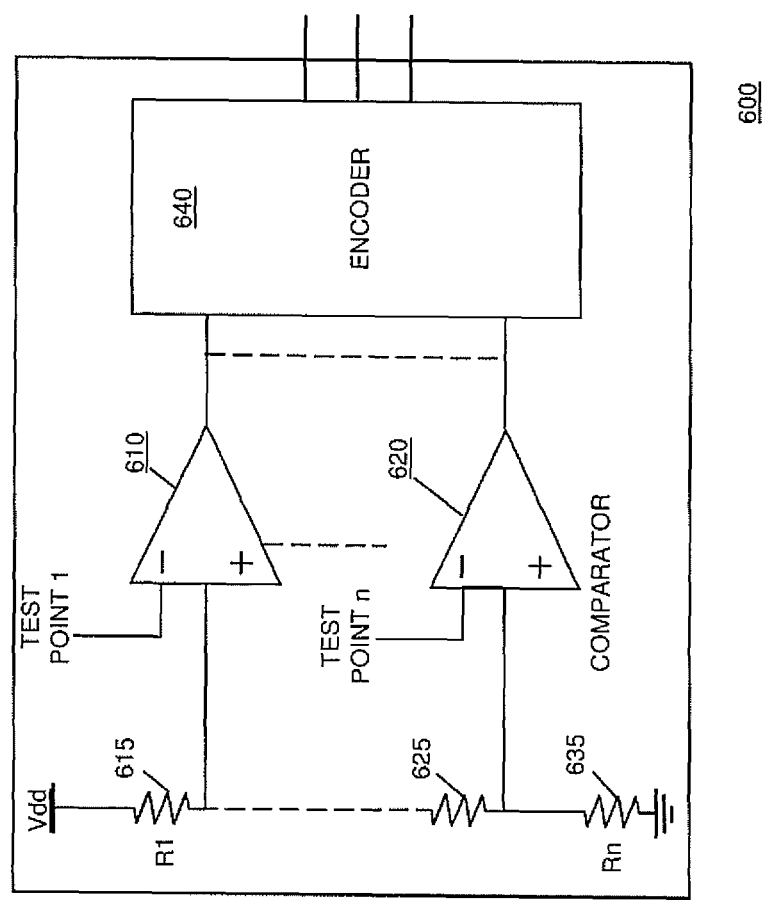
FIG. 6 is a schematic block diagram of a monitor module according to an embodiment of the present invention.

FIG. 6 illustrates a monitor module 600 according to an embodiment of the invention. The monitor module 600 is arranged to output a value indicative of an IR-drop (or voltage drop) at a location within a digital system, such as the digital system illustrated in FIG. 2.

The monitor module 600 comprises a plurality of comparators arranged to output a signal indicative of a comparison between a voltage at a test point within a digital system and a reference voltage.

The monitor module 600 illustrated in FIG. 6 comprises a potential divider formed by a series of resistors 615, 625, 635 arranged to generate a plurality of reference voltages at points between the resistors 615, 625, 635. It will be realized that the plurality of reference voltages may be generated in other ways. The monitor module comprises a plurality of comparators 610, 620. In some embodiments there may be n resistors 615, 625, 635 and n−1 comparators 610, 620. Each comparator 610, 620 is provided with a reference voltage to its non-inverting input. An inverting input of each comparator is connected to a test point 1 to n typically each located in a different location of the digital system 200. The test points may be selected as locations in the digital system having voltage-sensitive locations.

A first comparator 610 may be connected to a first test point and an nth comparator 620 may be connected to an nth test point. An output of each of the comparators 610, 620 is provided to an encoder 640. The outputs of the comparators are indicative of whether a voltage at the test point in the digital system is greater or smaller than the reference voltage provided to the comparator 610, 620. The encoder 640, responsive to the outputs from the comparators 610, 620, is arranged to generate IR-drop data which is a digital value indicative of the outputs of the plurality of comparators 610, 620. That is, the generated IR-drop data output by the encoder 640 is indicative of a relationship between the voltages at the test points in the digital system and the reference voltages.

Figure 7:
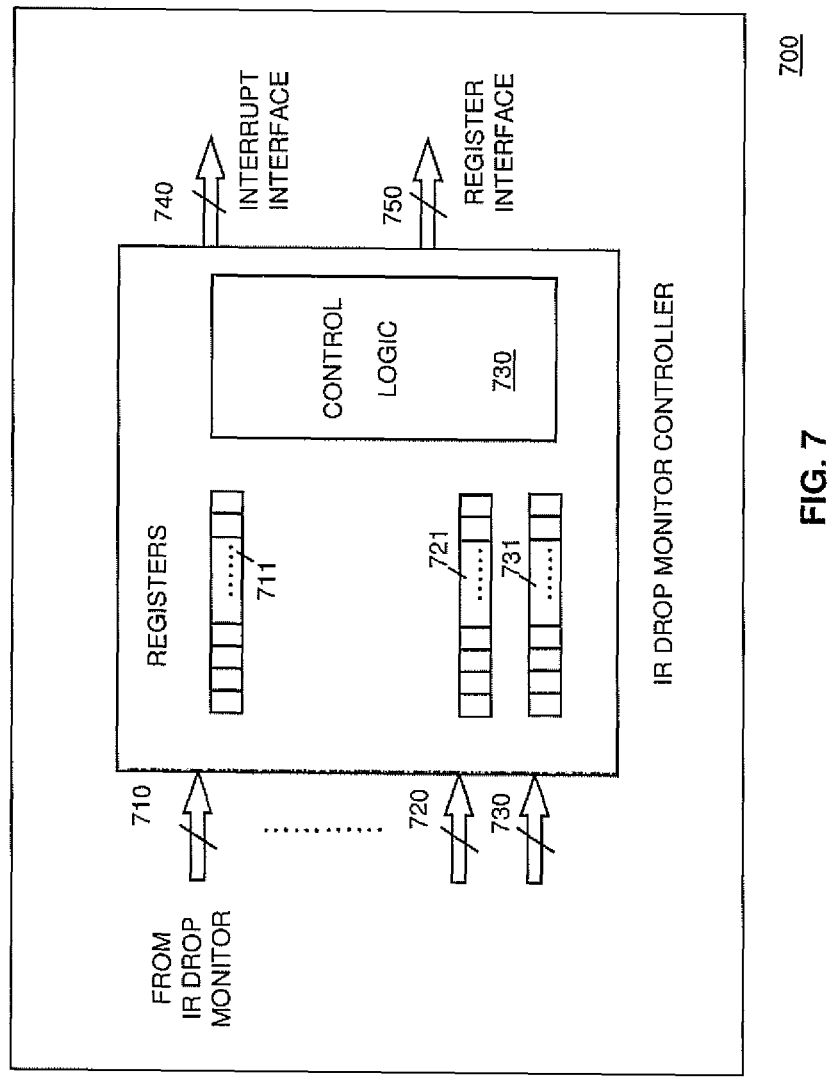
FIG. 7 is a schematic block diagram of a IR-drop controller according to an embodiment of the present invention.

FIG. 7 illustrates an IR-drop controller 700 according to an embodiment of the invention. The IR-drop controller 700 is arranged to receive information indicative of voltages at a plurality of test locations within a digital system and to control clock skew for one or more domains of the digital system responsive thereto.

The IR-drop controller 700 shown in FIG. 7 comprises one or more inputs arranged to receive IR-drop data from at least one corresponding IR-drop module 600, as described with reference to FIG. 6. The IR-drop controller 700 comprises first, second and third inputs 710, 720, 730 each arranged to receive a digital value from a corresponding IR-drop module 600. The digital value may comprise a plurality of bits. It will be realized, however, that the IR-drop controller 700 may comprise other numbers of inputs 710, 720, 730. As noted, the IR-drop data received at each input 710, 720, 730 is indicative of a relationship between the voltages at the test points in the digital system and corresponding reference voltages. The IR-drop controller 700 comprises, for each input 710, 720, 730, a register 711, 721, 731. The registers 711, 721, 731 are used to store the digital value received on the corresponding input 710, 720, 730.

The IR-drop controller 700 comprises logic arranged to determine whether, based on the received one or more digital values, it is necessary to adjust a clock skew of one or more domains in the digital system. The logic may determine it is necessary to adjust the clock skew when an IR-drop at one or more locations in the digital system exceeds a predetermined value. The domain may be chosen based on the location at which the IR-drop exceeds the predetermined value, for example the domain which encompasses the location having excessive IR-drop. In the illustrated embodiment shown in FIG. 7 the logic is implemented as control logic 730 which may be formed by a processor of the controller 700. The control logic 730 may associate locations of the digital system to the received digital values.

The controller 700 comprises an interrupt interface 740 and a register interface 750. The control logic 730 is arranged to cause the interrupt interface 740 to output an interrupt responsive to a determination that one or more locations in the digital system are experiencing excessive IR-drop. The interrupt may halt a problematic operation responsible for the excessive IR-drop. The control logic 730 is further arranged to cause the register interface 750 to output a digital value to control a clock skew of one or more domains of the digital system. The output of the register interface 750, representing skew data, may be received at a corresponding register interface input 207 of one or more clock control modules 200 or clock generation modules 500. The skew data may be indicative of a change in clock skew for at least some of the domains in the digital system responsive to the determination of excessive IR-drop. The IR-drop controller 700 may output data indicative of a change in operating frequency of the digital system, such as a reduction in operating frequency. The IR-drop controller 700 may reduce the operating frequency in order to at least partly assist in addressing the excessive IR-drop in the digital system.

Figure 8:
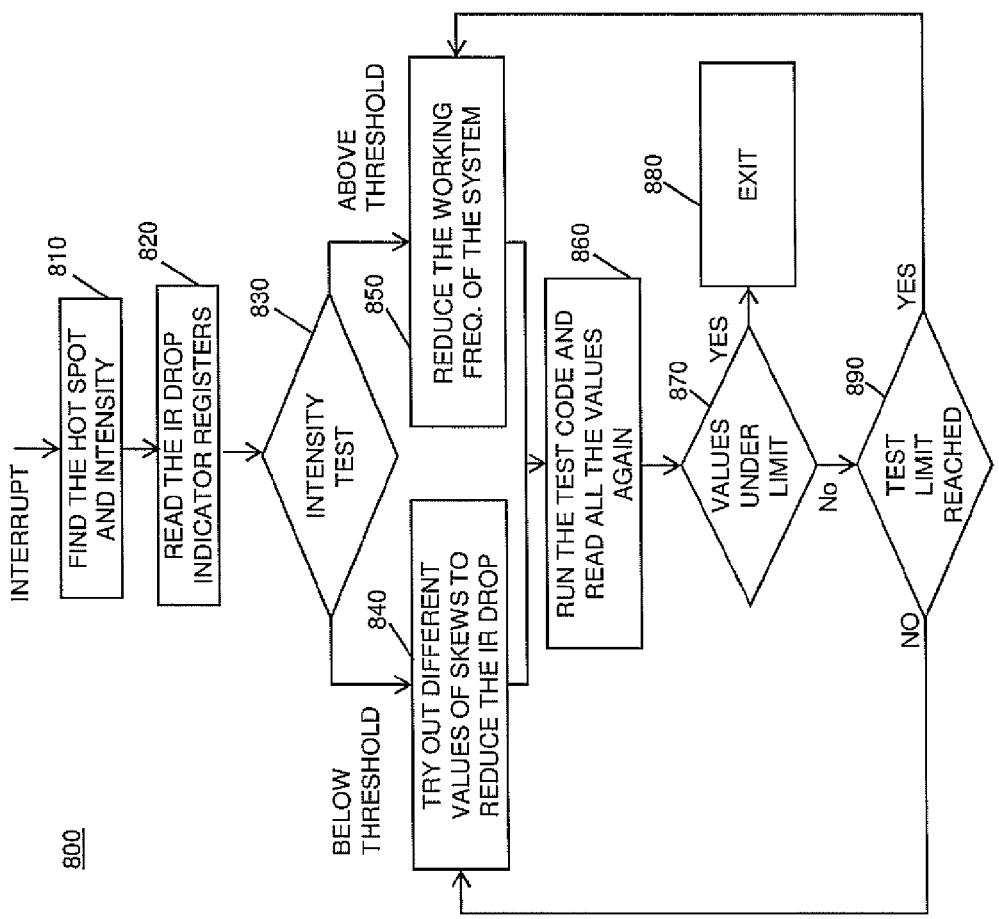
FIG. 8 is a flow chart of a method according to a further embodiment of the present invention.

FIG. 8 illustrates a method 800 according to an embodiment of the invention. The method 800 is a method of controlling IR-drop in a digital system. The method comprises controlling clock skew in a plurality of domains of the digital system. The digital system may be the digital system 200 illustrated with reference to FIG. 2. The method 200 may be performed by the controller 700 described with reference to FIG. 7.

The method comprises a step 810 of receiving IR-drop data. The IR-drop data may be received from one or more IR-drop modules 600 as previously described with reference to FIG. 6.

In step 820 a location of excessive IR-drop in the digital system is determined based on the IR-drop data received in step 810. The IR-drop data may indicate that one or more locations in the digital system are experiencing IR-drop. The one or more locations may be referred to as a "hot-spot" in the digital system. Step 820 may comprise outputting an interrupt to halt or pause the problematic operation in order to allow the IR-drop to be managed or reduced.

In step 830 a test is performed to determine whether the IR-drop is above a predetermined threshold based on a test routine performed by the digital system. The test routine is sequence a predetermined sequence of instructions or operations to be performed by the digital system. If, when performing the test routine, the IR-drop is greater than a predetermined threshold, such as a voltage of 100 mV although it will be realized that other voltages may be chosen, the method moves to step 850. If the IR-drop is less than the threshold the method moves to step 840.

In step 840 a clock skew of one or more domains in the digital system is changed. The clock skew of the one or more domains may be changed by the IR-drop controller 700 outputting skew data indicative of the changed clock skew to one or more clock control modules 210 of the digital system.

In step 850 an operating frequency of the digital system is reduced. The operating frequency may be reduced by a predetermined amount or frequency in each iteration of step 850.

In step 860 the intensity test performed in step 830 is repeated to determine whether the IR-drop continues to remain above the predetermined threshold. Step 860 comprises receiving updated IR-drop data since the data received in step 810 is not indicative of operation with changed operating characteristics of the digital system from either or both steps 840, 850.

In step 870 it is determined whether the updated IR-drop data is indicative of an IR-drop in digital system remaining above the predetermined threshold from step 830. If the IR-drop is within the predetermined threshold then the method ends in step 880. If, however, the IR-drop remains above the threshold then the method moves to step 890.

In step 890 it is determined whether a predetermined test limit has been reached. The predetermined test limit defines a number of times different clock skews are tested before the operating frequency of the digital system is reduced. For example, the test limit may define that 10 different clock skew values are tested before the operating frequency is reduced. If a current iteration number of step 890 is below the test limit then the method moves to step 840. If however the current iteration number is equal to the test limit then the method moves to step 850 where the operating frequency is reduced, as previously described. In this way, the method 800 described with reference to FIG. 8 detects an IR-drop in the digital above a predetermined threshold and attempts to reduce the IR-drop by one or both of changing clock skews of domains in the digital system and reducing the operating frequency of the digital system.

Advantageously, the present invention provides a method and apparatus for reducing IR-drop by dynamically adjusting clock skew for a plurality of domains within a digital system. The present invention further provides a method and apparatus for identifying IR-drop in a digital system.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. An integrated circuit, comprising:
    a plurality of domains each provided with one of a plurality of domain clock signals, wherein components of the integrated circuit within each domain are responsive to the provided one of the domain clock signals;
    a control module for determining a skew value for each of the plurality of domain clock signals; and
    a clock module for receiving a reference clock signal and generating the plurality of domain clock signals using the reference clock signal, wherein each domain clock signal is skewed from the reference clock according to the respective skew value,
    wherein the control module monitors peak current at one or more locations in the integrated circuit and changes the skew value for at least some of the domains of the integrated circuit in response to a determination of excessive peak current at one or more locations in the integrated circuit.

2. The integrated circuit of claim 1, further comprising a memory for maintaining a plurality of skew values for each of the domains of the integrated circuit, wherein the control module determines the skew value by selecting the skew value according to one or more operating characteristics of the integrated circuit.

3. The integrated circuit of claim 2, wherein the operating characteristics include one or both of an operating frequency and an operating voltage of the integrated circuit.

4. The integrated circuit of claim 1, wherein the control module changes the skew value for at least some of the domains, and determines whether a performance of the integrated circuit meets one or more performance criteria.

5. The integrated circuit of claim 1, wherein the clock module comprises:
    a plurality of buffers for delaying the reference clock signal by a phase shift; and
    a selector for selecting one of the representations for each domain clock signal according to the skew value for the respective domain.

6. The integrated circuit of claim 1, wherein the control module determines whether the integrated circuit meets one or more operation constraints based on the changed skew values.

7. The integrated circuit of claim 1, wherein the skew values are increased in response to a determination of excessive peak current at one or more locations in the integrated circuit.

8. The integrated circuit of claim 2, wherein the control module changes the operating frequency of the integrated circuit in response to a determination of excessive peak current at one or more locations in the integrated circuit and a determination that a predetermined number of times of changing the skew values has been reached.

* * * * *